(12) United States Patent
Lyon et al.

(10) Patent No.: US 7,339,216 B1
(45) Date of Patent: Mar. 4, 2008

(54) VERTICAL COLOR FILTER SENSOR GROUP ARRAY WITH FULL-RESOLUTION TOP LAYER AND LOWER-RESOLUTION LOWER LAYER

(75) Inventors: Richard F. Lyon, Los Altos, CA (US); Paul M. Hubel, Mountain View, CA (US); Mark O. Bagula, Morgan Hill, CA (US); Richard B. Merrill, Woodside, CA (US)

(73) Assignee: Foveon, Inc., Santa Clara, CA (US)

( * ) Notice: Subject to any disclaimer, the term of this patent is extended or adjusted under 35 U.S.C. 154(b) by 96 days.

(21) Appl. No.: 11/285,470

(22) Filed: Nov. 22, 2005

Related U.S. Application Data

(63) Continuation-in-part of application No. 10/738,484, filed on Dec. 17, 2003, now Pat. No. 6,998,660, and a continuation-in-part of application No. 10/355,723, filed on Jan. 31, 2003, now abandoned.

(51) Int. Cl.
*H01L 31/00* (2006.01)

(52) U.S. Cl. ............... 257/291; 257/440; 257/443; 257/E27.134

(58) Field of Classification Search .......... 257/222, 257/291, 443, 440, E31.121, E27.134, E27.135
See application file for complete search history.

(56) References Cited

U.S. PATENT DOCUMENTS

| | | | |
|---|---|---|---|
| 3,617,753 A | 11/1971 | Kato et al. | 250/211 J |
| 3,971,065 A | 7/1976 | Bayer | 358/41 |
| 4,011,016 A | 3/1977 | Layne et al. | 356/195 |
| 4,238,760 A | 12/1980 | Carr | 357/30 |

(Continued)

FOREIGN PATENT DOCUMENTS

EP 0 605 898 A1 12/1993

(Continued)

OTHER PUBLICATIONS

K.M. Findlater, et al., "A CMOS Image Sensor Employing a Double Junction Photodiode", *2001 IEEE Workshop on Charge-Coupled Devices and Advanced Image Sensors, IEEE Electron Devices Society (2001)*, pp. 60-63.

(Continued)

*Primary Examiner*—Minh-Loan T Tran
(74) *Attorney, Agent, or Firm*—Girard & Equitz LLP

(57) ABSTRACT

An array of vertical color filter (VCF) sensor groups, optionally including or coupled to circuitry for converting photogenerated carriers produced in the sensors to electrical signals, and methods for reading out any embodiment of the array. The array has a top layer (including the top sensors of the sensor group) and at least one low layer including other ones of the sensors. Only the top layer can be read out with full resolution. Each low layer can only be read out with less than full resolution to generate fewer sensor output values than the total number of pixel sensor locations. Typically, the sensor groups are arranged in cells, each cell including a S sensor groups (e.g., S=4), with S sensors in the top layer and fewer than S sensors in each low layer of the cell. Typically, each cell includes at least one shared sensor (a sensor shared by two or more VCF sensor groups) in each low layer, and each cell includes sensor selection switches (e.g., transistors) between the cell's sensors and a sense node.

17 Claims, 10 Drawing Sheets

U.S. PATENT DOCUMENTS

| | | | | |
|---|---|---|---|---|
| 4,309,604 | A | 1/1982 | Yoshikawa et al. | 250/226 |
| 4,581,625 | A | 4/1986 | Gay et al. | 357/30 |
| 4,613,895 | A | 9/1986 | Burkey et al. | 358/41 |
| 4,651,001 | A | 3/1987 | Harada et al. | 250/330 |
| 4,677,289 | A | 6/1987 | Nozaki et al. | 250/226 |
| 4,772,957 | A | 9/1988 | Nakagawa et al. | 358/280 |
| 5,397,734 | A | 3/1995 | Iguchi et al. | 437/70 |
| 5,502,299 | A | 3/1996 | Standley | 250/208.2 |
| 5,668,596 | A | 9/1997 | Vogel | 348/222 |
| 5,739,562 | A | 4/1998 | Ackland et al. | 257/291 |
| 5,872,371 | A | 2/1999 | Guidash et al. | 257/230 |
| 5,883,421 | A | 3/1999 | Ben Chouikha et al. | 257/461 |
| 5,889,315 | A | 3/1999 | Farrenkopf et al. | 257/552 |
| 5,899,714 | A | 5/1999 | Farrenkopf et al. | 438/202 |
| 5,965,875 | A | 10/1999 | Merrill | 250/226 |
| 6,078,037 | A | 6/2000 | Booth, Jr. | 250/208.1 |
| 6,111,300 | A | 8/2000 | Cao et al. | 257/440 |
| 6,320,618 | B1 | 11/2001 | Aoyama | 348/335 |
| 6,452,632 | B1 | 9/2002 | Umeda et al. | 384/294 |
| 6,455,833 | B1 | 9/2002 | Berezin | 250/208.1 |
| 6,593,558 | B1 | 7/2003 | Edgar | 250/208.1 |
| 6,657,755 | B1 | 12/2003 | Campbell | 358/514 |
| 6,753,585 | B1 | 6/2004 | Kindt | 257/440 |
| 2002/0058353 | A1 | 5/2002 | Merrill | |
| 2002/0130957 | A1 | 9/2002 | Gallagher et al. | |
| 2002/0190254 | A1 | 12/2002 | Turner et al. | |
| 2004/0125222 | A1 | 7/2004 | Bradski et al. | |
| 2004/0178463 | A1 | 9/2004 | Merrill et al. | |
| 2004/0178467 | A1 | 9/2004 | Lyon et al. | |
| 2004/0185597 | A1 | 9/2004 | Merrill et al. | |
| 2005/0248675 | A1 | 11/2005 | Hashimoto et al. | |

FOREIGN PATENT DOCUMENTS

| | | |
|---|---|---|
| JP | 61-187282 | 8/1986 |
| JP | 1-134966 | 5/1989 |
| WO | WO 98/19455 | 5/1998 |
| WO | WO 01/63914 A1 | 8/2001 |

OTHER PUBLICATIONS

I. Takayanagi, et al., "A Low Dark Current Stacked CMOS-APS for Charged Particle Imaging", *IEDM Technical Digest*, Washington, D.C., Dec. 2-5, 2001, pp. 551-554.

M. Bartek, et al., "An Integrated Silicon Colour Sensor Using Selective Epitaxial Growth", *Sensors and Actuators A: Physical*, 41-42 (1994), pp. 123-128.

P. Catrysse et al., "An Integrated Color Pixel in 0.18μm CMOS Technology", *2001 IEDM Technical Digest*, pp. 24.4.1-24.4.4.

D. Knipp, et al., "Low Cost Approach to Realize Novel Detectors for Color Recognition", *International Congress on Imaging Science*, Sep. 7-11, 1998, Antwerp, Belgium, pp. 350-353.

D. Pasquariello, et al., "Plasma-Assisted INP-to-Si Low Temperature Wafer Bonding", *IEEE Journal on Selected Topics in Quantum Electronics*, vol. 8, No. 1. Jan./Feb. 2002, pp. 118-131.

Sony, Inc., "Third Generation Diagonal 4.5 mm (Type ¼) 250K/380K-pixel Color CCD Image Sensor, 250K/290K Pixels, ICX226AK (NTSC), ICX227AK (PAL), 380K/440K Pixels, ICX228AK (NTSC), ICX220AK (PAL)", 2 pages, downloaded from the Internet on Nov. 18, 2002 from http://www.sony.net/products/sc-hp/cxpal/cxnews-20/pdf/n.1cx226.pdf.

Shellcase LTD., "ShellOP", 2 pages, downloaded from the Internet on Nov. 1, 2002 from http://www.shellcase.com/pages/products.asp.

Nayar, S.K. and Mitsunaga, T., "High Dynamic Range Imaging: Spatially Varying Pixel Exposures," *Proceedings of the IEEE Conference on Computer Vision and Pattern Recognition*, vol. 1, pp. 472-479, Jun. 2000.

Hiroki Miura, et al., "A 100 Frame/s CMOS Active Pixel Sensor for 3D Gesture Recognition System", *1999 IEEE International Solid-State Circuits Conference*, pp. 142-143.

M. Ben Chouikha, et al., "Buried Triple p-n Junction Structure in a BiCMOS Technology for Color Detection", *1997 IEEE BCTM 6.4*, pp. 108-111.

M. Ben Chouikha, et al., "Color Sensitive Photodetectors in Standard CMOS and BiCMOS Technologies", *Advanced Focal Plane Arrays and Electronic Cameras proceedings*, Oct. 9-10, 1996, Berlin, Germany SPIE Proceedings Series, vol. 2950, pp. 108-120.

Kramer, J., "Photo-ASICs: Integrated Optical Metrology Systems with Industrial CMOS Technology", *Paul Scherrer Institute Zurich (PSIZ)*, 1993, pp. 4-91.

R.M. Guidash, et al., "A O.6 μm CMOS Pinned Photodiode Color Imager Technology", *1997 IEDM Tech. Digest*, pp. 927-929.

Chamberlain, S.G., "Photosensitivity and Scanning of Silicon Image Detector Arrays", *IEEE Journal of Solid State Circuits*, vol. SC-4, No. 6, Dec. 1969, pp. 333-342.

VERTICAL COLOR FILTER SENSOR GROUP ARRAY WITH FULL-RESOLUTION TOP LAYER AND LOWER-RESOLUTION LOWER LAYER

RELATED APPLICATIONS

This application is a continuation in part of U.S. patent application Ser. No. 10/738,484, filed Dec. 17, 2003, and issued as U.S. Pat. No. 6,998,660 on Feb. 14, 2006, and a continuation in part of U.S. patent application Ser. No. 10/355,723, filed Jan. 31, 2003, now abandoned entitled VERTICAL COLOR FILTER SENSOR GROUP WITH CARRIER-COLLECTION ELEMENTS OF DIFFERENT SIZE AND METHOD FOR FABRICATING SUCH A SENSOR GROUP.

BACKGROUND OF THE INVENTION

1. Field of the Invention

The present invention relates to arrays of photosensitive sensor groups, each sensor group comprising vertically stacked sensors (typically, vertically stacked red, green, and blue sensors), and each sensor group in the array positioned at a different pixel location. In each sensor group, semiconductor material chromatically filters incident electromagnetic radiation vertically (optionally, other material also filters the radiation) and each sensor simultaneously detects a different wavelength band.

2. Background of the Invention

The term "radiation" is used herein to denote electromagnetic radiation.

The expression "top sensor" (of a sensor group) herein denotes the sensor of the group that radiation, incident at the sensor group, reaches before reaching any other sensor of the group. The expression that the sensors of a sensor group are "vertically stacked" denotes that one of the sensors is a top sensor of the group, and that the group has an axis (sometimes referred to as a "vertical axis") that extends through all the sensors. A vertical color filter ("VCF") sensor group typically includes vertically stacked sensors configured such that the group's top sensor has a top surface that defines a normal axis (e.g., is at least substantially planar), and when radiation propagating along a vertical axis of the group is incident at the group, the radiation is incident at the top sensor with an incidence angle of less than about 30 degrees with respect to the normal axis (e.g., the radiation is normally incident at the group). Typically, a VCF sensor group consists of three vertically stacked sensors: a blue sensor, a green sensor, and a red sensor.

An array of VCF sensor groups defines an imaging plane. Typically, each VCF sensor group of an array has a top sensor having a top surface that defines a normal axis, the top surfaces of the array's sensor groups are parallel to each other, and the array's imaging plane has a normal axis (the "array's vertical axis") that is parallel to the normal axis of each group.

The expression used herein that two elements, included in a structure having a vertical axis, are "laterally" (or "horizontally") separated denotes that there is an axis parallel to the vertical axis that extends between the elements but intersects neither element. The expression that an item "comprises" an element is used herein (including in the claims) to denote that the item is or includes the element.

The "size" of each sensor of a VCF sensor group is the area (projected in a plane perpendicular to a vertical axis of the group) of the sensor's carrier-collection element. The expression "minimum-sized" sensor of a VCF sensor group herein denotes each sensor of the group whose carrier-collection element has an area (projected in a plane perpendicular to a vertical axis of the group) that is less than or equal to the area (projected in the same plane) of the carrier-collection element of each other sensor of the group.

The expression "pixel sensor location" within an array of VCF sensor groups herein denotes the location of one of the VCF sensor groups. The location of the relevant VCF sensor group is determined in an appropriate way given the sensor group's configuration. For example, when the sensors of a VCF sensor group have different sizes and the carrier-collection element of each of the group's sensors has an optical center, the group's location may be the area-weighted average of the positions of projections of the optical centers of group's sensors on a plane perpendicular to a vertical axis of the group. Or, the location of a VCF sensor group in an array may be the area-weighted average of the positions of projections of the optical centers of group's minimum-sized sensors on a plane perpendicular to a vertical axis of the group (or the position of the projection of the optical centers of group's minimum-sized sensor on such plane, if the group has only one minimum-sized sensor). Thus, in an array of VCF sensor groups comprising a green layer (comprising 4N green sensors, where N is a number), a blue layer (comprising N blue sensors), and a red layer (comprising N red sensors), with all green sensors having the same size, each blue sensor and red sensor having size four times that of each green sensor, and each blue sensor and red sensor shared by four VCF sensor groups, the array would have 4N pixel sensor locations.

MOS active pixel sensors are known in the art. Multiple-wavelength band arrays of active pixel sensors are also known in the art. One type of multiple-wavelength band active-pixel-sensor array employs red, green, and blue sensors disposed horizontally in a pattern at or near the semiconductor surface. Color overlay filters are employed to produce the color selectivity between the red, green, and blue sensors. Such sensors have the disadvantage of occupying a relatively large area per resolution element as these sensors are tiled together in a plane. In addition, reconstruction of a color image from such a sensor array is computationally intensive and often results in images with artifacts, defects, or inferior resolution.

Several types of VCF sensor groups and methods for fabricating them are described in U.S. Pat. No. 6,727,521, issued Apr. 27, 2004, and in U.S. Pat. No. 6,864,557, issued on Mar. 8, 2005. A VCF sensor group includes at least two photosensitive sensors that are vertically stacked with respect to each other (with or without non-sensor material between adjacent sensors). Each sensor of a VCF sensor group has a different spectral response. Typically, each sensor has a spectral response that peaks at a different wavelength. In some embodiments, a VCF sensor group (or one or more of the sensors thereof) includes a filter that does not also function as a sensor.

A VCF sensor group simultaneously senses photons of at least two wavelength bands in the same area of the imaging plane. In contrast, time sequential photon sensing methods do not perform photon sensing at the same time for all wavelength bands. The sensing performed by a VCF sensor group included in an imager occurs in one area of the imager (when the imager is viewed vertically), and photons are separated by wavelength as a function of depth into the sensor group.

Typically, each sensor detects photons in a different wavelength band (e.g., one sensor detects more photons in the "blue" wavelength band than each other sensor, a second sensor detects more photons in the "green" wavelength band than each other sensor, and a third sensor detects more photons in the "red" wavelength band than each other sensor), although the sensor group typically has some "cross-talk" in the sense that multiple sensors detect photons of the same wavelength.

VCF sensor groups can be used for a variety of imaging tasks. In preferred embodiments, they are used in digital still cameras. However they can be employed in many other systems, such as linear imagers, video cameras and machine vision equipment.

A VCF sensor group uses the properties of at least one semiconductor material to detect incident photons, and also to selectively detect incident photons of different wavelengths at different depths in the group. The detection of different wavelengths is possible due to the vertical stacking of the sensor layers of the sensor group in combination with the variation of optical absorption depth with wavelength in semiconductor materials. The costs of manufacturing VCF sensor groups are substantially reduced because VCF sensor groups do not require external color filters (as are traditionally used in color image sensors) and do not require color filters that are distinct from the sensors themselves (the sensors themselves are made of semiconductor material that itself provides a filtering function). However, in some embodiments of the invention, VCF sensor groups do include (or are used with) color filters that are distinct from the sensors themselves. The spectral response characteristics of VCF color sensor groups typically are much more stable and less sensitive to external factors such as temperature or other environmental factors (that may be present during or after manufacturing) than are conventional color sensors with non-semiconductor based filters.

A VCF sensor group is preferably formed on a substrate (preferably a semiconductor substrate) and comprises a plurality of vertically stacked sensors configured by doping and/or biasing to collect photo-generated carriers of a first polarity (preferably negative electrons). The sensors include (or pairs of the sensors are separated by) one or more reference layers configured to collect and conduct away photo-generated carriers of the opposite polarity (preferably positive holes). The sensors have different spectral sensitivities based on their different depths in the sensor group, and on other parameters including doping levels and biasing conditions. In operation, the sensors are individually connected to biasing and active pixel sensor readout circuitry. VCF sensor groups and methods for fabricating them are discussed more fully in above-referenced U.S. Pat. Nos. 6,727,521 and 6,864,557.

Arrays of VCF sensor groups, such as some of those described in above-cited U.S. patent application Ser. Nos. 10/738,484 and 10/355,723, have important advantages over arrays of single-layer sensors (e.g., conventional arrays having a Bayer pattern, and arrays that implement conventional color-filter-mosaic technologies), including the advantages of measuring luminance at every pixel sensor location and measuring color in a way that does not induce color aliasing artifacts. The additional advantage of measuring color at every pixel sensor location to achieve good chroma resolution is less important and can be sacrificed by implementing one layer (e.g., the green, red, or blue layer) of an array of VCF sensor groups to be readable with (to "have") full resolution and at least one other layer of the array to have lower resolution (e.g., as described in above-cited U.S. patent application Ser. Nos. 10/738,484, and 10/355,723).

For example, the green layer of an array of VCF sensor groups can be implemented to have with full resolution, the outputs of clusters of sensors in the blue layer can be combined to implement the blue layer with less than full resolution, and the outputs of clusters of sensors in the red layer can be combined to implement the red layer with less than full resolution. Such an array in which all the sensors have substantially the same size, the top layer is the blue layer, the green layer is between the blue layer and the red layer, each cluster of sensors in the blue layer includes four sensors (e.g., is a two sensor by two sensor cluster), and each cluster of sensors in the red layer includes four sensors (e.g., is a two sensor by two sensor cluster), is referred to herein as a "1-4-1" array (or an array having "1-4-1" organization) to indicate that the resolution of the green layer is higher by a factor of four than that of each of the red and blue layers.

The term "output" of a sensor (of a VCF sensor group) herein denotes a signal indicative of incident photon intensity at the sensor (for example, a signal indicative of photogenerated charge). The expression that the outputs of sensors of a layer of a VCF sensor group array are "combined" herein denotes that the sensors have distinct, laterally separated carrier-collection elements, and these elements are electrically coupled together (e.g., by conductors deposited on the surface of the array and/or conductors coupled to the array) during readout of the elements.

The notation that an array of VCF sensor groups is an "X-Y-Z" array (or has "X-Y-Z" organization) herein assumes that each sensor group includes a top ("Z") sensor (typically a blue sensor), an intermediate ("Y") sensor (typically a green sensor) below the top sensor, and a third ("X") sensor (typically a red sensor) below the intermediate sensor (and the array consists of a top layer of top sensors, an intermediate layer of intermediate sensors, and a third layer of third sensors), and denotes that the ratio of the top layer's resolution to the intermediate layer's resolution is Z/Y and the ratio of the intermediate layer's resolution to the third layer's resolution is Y/X. Typically, an X-Y-Z array is an array having a top ("Z" or "blue") layer of blue sensors, an intermediate ("Y" or "green") layer of green sensors, and a bottom ("X" or "red") layer of red sensors.

In another 1-4-1 array in which the top layer is the blue layer, and the green layer is between the blue layer and the red layer, all sensors in the green layer have substantially the same size and each sensor in each of the blue layer and red layer has size substantially equal to four times the size of each green layer sensor. Each sensor in each of the blue and red layers is shared by four VCF sensor groups in the sense that its carrier-collection element is shared by these four sensor groups.

"1-4-1" arrays of VCF sensor groups have an advantage in that their green channel response is not very far from a theoretically ideal luminance spectral sensitivity curve, and thus they can adequately capture high frequency luminance information while also realizing their implementation advantages relative to 4-4-4 arrays having red, green, and blue sensors of the same size as the green sensors of the 1-4-1 arrays. However, the full-resolution readout of green in such 1-4-1 arrays undesirably requires four separate contacts to the green layer (per each contact to the red layer). Each contact to the red or green layer undesirably occupies much space in the array.

U.S. patent application Ser. No. 10/738,484 discloses an array of VCF sensor groups in which each group includes a blue sensor, a green sensor, and a red sensor. Each of the red sensor and green sensor of each group is larger than the group's blue sensor and is shared with at least one other VCF sensor group. The blue sensors are typically implemented near the top surface of a semiconductor wafer and the red sensors deeper in the wafer. The size of each red sensor is roughly four times the size of each blue sensor, and sets of four adjacent VCF sensor groups share a single red sensor. Each green sensor's size can be about half the size of each red sensor (or can be the same as each blue sensor's size or can be any of a variety of other sizes). An implementation of such an array in which the each red sensor's size is four times the size of each blue sensor, the size of each green sensor is about half the size of each red sensor, the top layer is the blue layer, and the bottom layer is the red layer is a "1-2-4" array (or an array having "1-2-4" organization) in the sense that the resolution of its green layer is higher by a factor of two than that of its red layer and the resolution of its blue layer is higher by a factor of four than that of the red layer.

BRIEF DESCRIPTION OF THE INVENTION

In a class of embodiments, the invention is an array of VCF sensor groups, each VCF sensor group including at least two vertically stacked, photosensitive sensors. Preferably, the array consists essentially of solid material (e.g., typical crystalline Silicon) including structures formed on a substrate (e.g., is implemented as a block of solid material having structures formed on a semiconductor substrate by a semiconductor integrated circuit fabrication process), and includes readout circuitry coupled to the sensor groups. Each VCF sensor group includes a top sensor and at least one other sensor below the top sensor. The top sensors of all the sensor groups together constitute a top layer of sensors. The other sensors of the sensor groups together constitute at least one "low" layer of sensors below the top layer. Typically, each sensor group includes three sensors (including the top sensor) and the array includes three layers of sensors. In accordance with the invention, the array is configured so that only the top layer of sensors can be read out with full resolution (to generate a top sensor output value for every pixel sensor location) and each other layer can only be read out with less than full resolution (i.e., to generate fewer sensor output values than the total number of pixel sensor locations).

In some embodiments, the array has a top surface and includes readout circuitry at (e.g., on) the top surface, a top layer of sensors of the array includes "X" top sensors (where X is some number), each low layer of sensors of the array includes fewer than X sensors, and a contact extends from each sensor in each low layer to the readout circuitry. In some such embodiments, the array consists essentially of solid material including a semiconductor substrate, each low layer of sensors is implemented between the substrate and the top surface, and a contact (e.g., plug or trench contact) extends from each sensor in each low layer to the readout circuitry. For example, a "1-1-4" implementation of such an array having two low layers (a bottom layer and an intermediate layer between the top and bottom layers) can include 4Y blue sensors in the top layer, Y green sensors in the intermediate layer, and Y red sensors in the bottom layer, and a total of 2Y vertical contacts between the red and green sensors and the readout circuitry.

In a class of embodiments, the inventive array is an N×M array of sensor group cells, where each cell includes "S" VCF sensor groups, and S is a small integer (e.g., S=4). The top sensors of all sensor groups of each cell together constitute a top layer of sensors, and the other sensors of each cell together constitute at least one low layer of sensors below the top layer. Each cell includes S sensors in the top layer and fewer than S sensors in each low layer. In preferred embodiments in this class, each cell includes at least one shared sensor in each low layer. The array is typically implemented a block of solid material including structures formed on a substrate (e.g., by a semiconductor integrated circuit fabrication process). Each cell includes sensor selection switches (e.g., transistors formed on or at a top surface of the array) coupled between the cell's sensors and a single "sense" node. The sensor selection switches are controlled during readout to accomplish sequential readout of each of the cell's sensors at the cell's sense node (e.g., by asserting a sequence of voltages, each indicative of the output of a different one of the sensors, at the sense node). For example, when S=4, each cell can include six sensor selection switches: one coupled to a shared sensor in a first low layer; another coupled to a shared sensor in a second low layer below the first low layer; and each of the other four coupled to different non-shared, top layer sensor. In this example, the sensor selection switches are controlled during readout to accomplish sequential readout of the four non-shared sensors and two shared sensors of each set by circuitry coupled to the sense node. Such use of sensor selection switches for each cell can allow the array to be implemented with much simpler surface layer geometry than can a conventional VCF sensor group array having the same number of VCF sensor groups.

The relatively low resolution at which each low layer of the inventive array is read out allows the array to be implemented on a semiconductor substrate with fewer contacts (e.g., plug or trench contacts) to the low layer(s) than if each low layer were configured to be read out with full resolution, and can result in a better signal-to-noise ratio than can be achieved by conventional arrays. Because each plug, trench, or other contact to a low layer undesirably occupies space in the array and typically increases the array's cost and complexity, it is desirable to minimize the number of such contacts.

Another aspect of the invention is a method for reading out any embodiment of the inventive array, including the steps of reading out the array's top layer with full resolution and reading out each other layer with less than full resolution. Optionally, the inventive array includes (or is coupled to) circuitry for converting photogenerated carriers produced in the array's sensors to electrical signals.

In preferred implementations of the inventive array, each VCF sensor group includes a top sensor (typically a blue sensor), an intermediate sensor (typically a green sensor) below the top sensor, and a third sensor (typically a red sensor) below the intermediate sensor, the array comprises a top layer of top sensors, an intermediate layer of intermediate sensors, and a third layer of third sensors, and the array is read out as a "1-1-4" array in the sense that its top layer (typically comprising blue sensors) has a resolution that is higher by a factor of four than that of the intermediate layer (typically comprising green sensors) and the third layer (typically comprising red sensors). Preferably, the array is implemented on a semiconductor substrate with fewer contacts (e.g., plug or trench contacts) to the intermediate and third layers than if the intermediate and third layers were configured to be read out with full resolution. Another aspect of the invention is a method for reading out such an array, including the steps of reading out the top layer with full resolution and reading out the intermediate and third layers with less than full resolution.

Preferred embodiments of the inventive array include at least one shared sensor in each low layer. Alternatively, each low layer includes fewer sensors than does the top layer (e.g., every VCF sensor group includes a top sensor that is a blue sensor, at least one sensor groups includes a red sensor but no green sensor below its blue sensor, and at least one sensor group includes a green sensor but no red sensor below its blue sensor).

In shared sensor embodiments of the inventive array, at least one VCF sensor group includes a sensor (in a low layer) whose carrier-collection element is shared with at least one other VCF sensor group. In a class of shared sensor embodiments, the inventive array is read out as a "1-1-4" array, the size of each sensor in each low layer (e.g., each green and red sensor) is equal (or substantially equal) to four times the size of each top sensor. In preferred implementations in this class in which each top sensor is a blue sensor, full resolution readout of the blue (top) layer and lower resolution readout of green and red layers can generate luminance information having the same spatial frequency for incident blue light and incident green light, although the blue channel's spectral response is less ideal (farther from a theoretically ideal luminance spectral sensitivity curve) than is the green channel's spectral response, because the full resolution blue layer of each such implementation responds to green and red light as well as blue light. These implementations of the invention can adequately capture high resolution luminance information, while their full resolution readout of the top (blue) layer and lower resolution readout of the other (green and red) layers also provides advantages (e.g., compactness, noise improvement, and reduction in the number of contacts that must be provided to sensors in the green and red layers) that cannot be realized by full resolution readout of the intermediate (green) layer of a "1-4-1" array and lower resolution readout of the blue and red layers of the "1-4-1" array.

DETAILED DESCRIPTION OF THE PREFERRED EMBODIMENTS

Persons of ordinary skill in the art will realize that the following description of the present invention is illustrative only and not in any way limiting. Other embodiments of the invention will readily suggest themselves to such skilled persons having the benefit of this disclosure.

Each sensor of a VCF sensor group senses photons by directly or indirectly converting their energy into electron-hole pairs. This conversion occurs in semiconducting material. A VCF sensor group is typically implemented so that the output of each sensor in the group is indicative of incident photon intensity in a different wavelength band. The radiation that reaches each sensor in a VCF sensor group has a different wavelength-intensity spectrum due to the filtering action of the material forming the sensor group. Thus, all sensors in a VCF sensor group can be identical and each sensor can still produce an output that is indicative of a different wavelength band. In some embodiments, however, the sensors in a VCF sensor group are not all identical (e.g., they do not all consist of the same material or combination of materials), and the structure and composition of each is determined so as to optimize or improve the sensor group's performance for a predetermined application. For example, a sensor having relatively high sensitivity to a given range of wavelengths (i.e., relatively high absorptivity in such range) and lower sensitivity to other wavelengths, can be vertically stacked with sensors made of other materials having different spectral sensitivity to form a VCF sensor group.

Color output for a digital still camera (DSC) requires sensing of a minimum of three spectral bands due to the tri-chromatic nature of the human visual system. Thus, many embodiments of VCF sensor groups have three vertically stacked sensors (each comprising semiconductor material) for sensing three different spectral bands. VCF sensor groups with two rather than three vertically stacked sensors are useful in other applications, such as for simultaneous detection of visible and infrared radiation. Since there can be advantages to sensing more than three spectral regions, some embodiments of a VCF sensor group have more than three vertically stacked sensors. Using the extra information from additional spectral regions, it can be possible to produce a more accurate representation of the color of an object. As more spectral data are available, the accuracy of color representation potentially improves.

Figure 2:
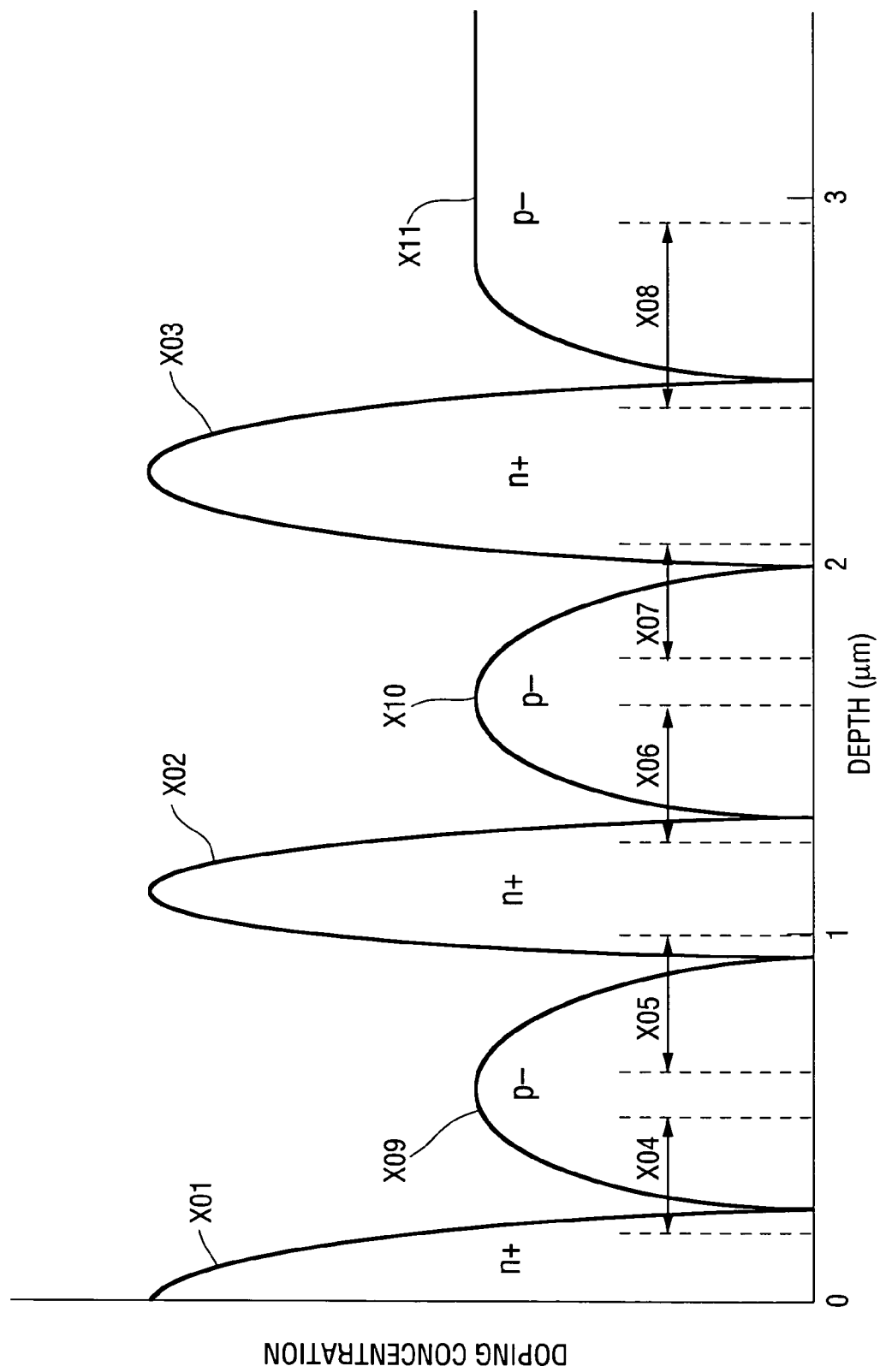
FIG. 2 is a graph indicative of a vertical doping profile for a VCF sensor group that can be used to implement the invention.

In a class of embodiments of the inventive array of VCF sensor groups, each sensor of each sensor group includes two layers of semiconductor material (as does the sensor comprising layer X01 and an adjacent portion of layer X09 in FIG. 2) or three layers of semiconductor material (as does the sensor comprising layer X02 and adjacent portions of layers X09 and X10 in FIG. 2), there is a junction (e.g., a "p-n" junction or heterojunction) between each two adjacent layers of a sensor, and one of the sensor's layers is a carrier-collection element having a contact portion (accessible to biasing and readout circuitry). During typical operation, the layers of each sensor are biased so that photogenerated carriers migrate through at least one depletion region to the contact to make a photocharge signal available at the contact portion. In typical embodiments of a VCF sensor group, the group includes material (e.g., the semiconductor material of layer X09 in FIG. 2 that belongs neither to depletion region X04 nor depletion region X05) in which photons can be absorbed and such absorption is likely to produce charge that is detected by readout circuitry, but in which photogenerated carriers can migrate (with significant probability) toward any of at least two different carrier-collection elements. Typically, but not necessarily, all layers of a VCF sensor group consist of semiconductor material.

Figure 1:
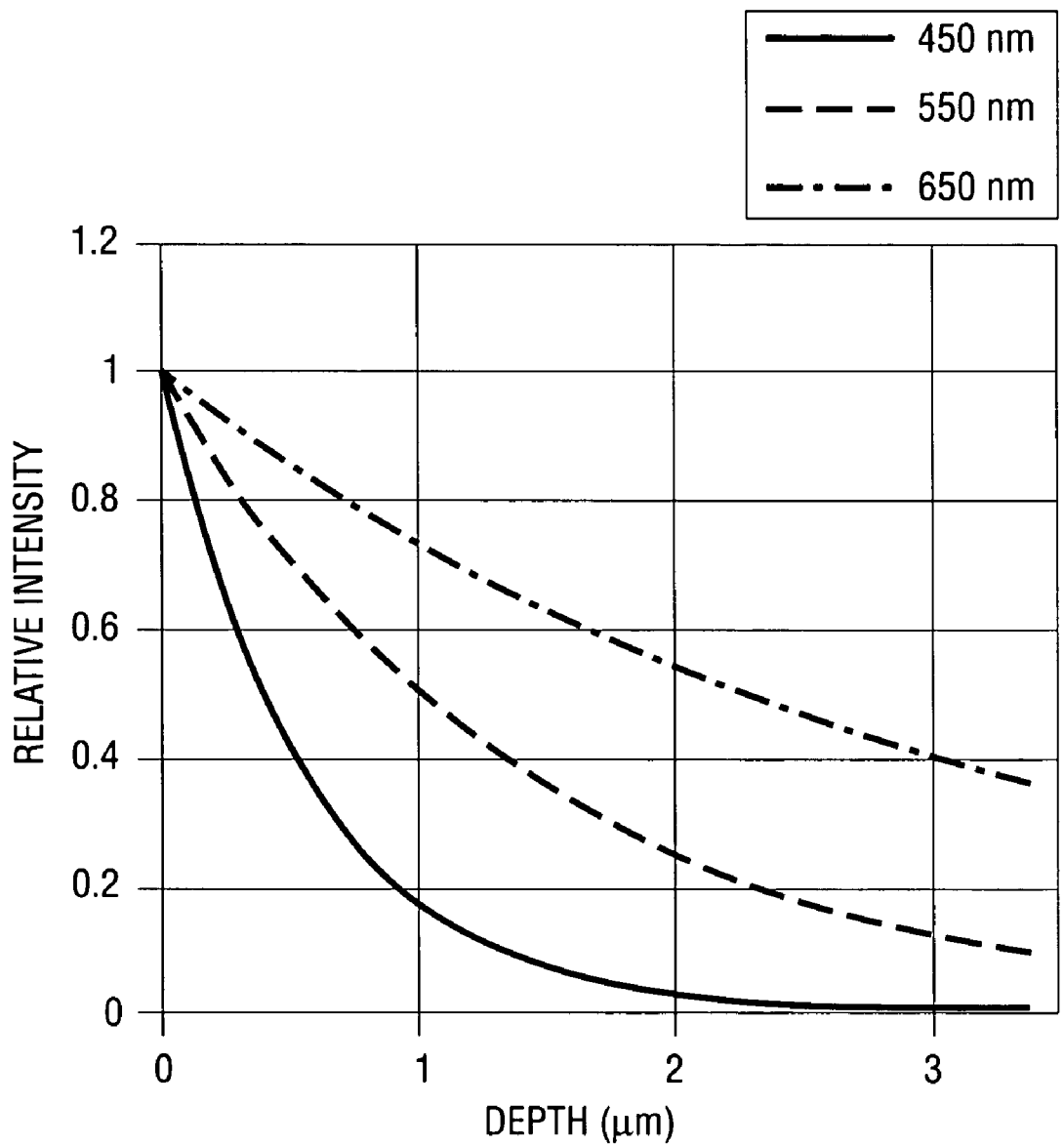
FIG. 1 is a graph of the intensity of electromagnetic radiation in crystalline silicon (relative to its incident intensity $I_0$) as a function of depth (in microns) in the silicon, for the wavelengths 450 nm, 550 nm, and 650 mm.
Figure 4:
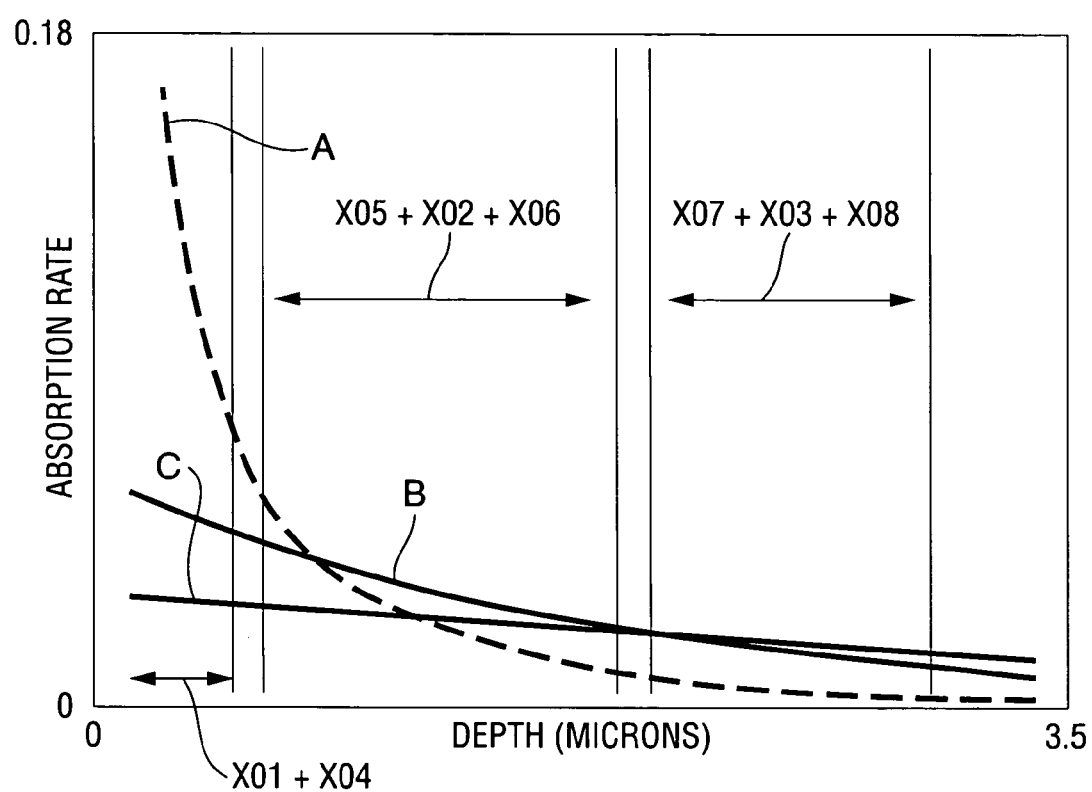
FIG. 4 is a graph of the absorption rate of electromagnetic radiation in crystalline silicon (relative to its incident intensity $I_0$) as a function of depth (in microns) in the silicon, for the wavelengths 450 nm (curve A), 550 nm (curve B), and 650 nm (curve C), with indications of the locations of the FIG. 2 sensor group's layers overlayed thereon.

FIG. 1 is a graph of the intensity of electromagnetic radiation in crystalline silicon (relative to its incident intensity $I_0$) as a function of depth in the silicon, for the wavelengths 450 nm, 550 nm, and 650 nm. FIG. 4 is a graph of the absorption rate of electromagnetic radiation in crystalline silicon (relative to its incident intensity $I_0$) as a function of depth in the silicon, for the wavelengths 450 nm (curve A), 550 nm (curve B), and 650 nm (Curve C), with indications of the locations of the FIG. 2 sensor group's layers overlayed thereon. The graphs of FIGS. 1 and 4 are generated from the same data. Each curve of FIG. 4 plots difference values, with the "n"th difference value being the difference between the "(n+1)"th and "n"th data values of the corresponding curve of FIG. 1. The intensity of radiation (having a given wavelength) as a function of depth in many semiconductors other than silicon is a function similar to those graphed in FIG. 1. FIG. 1 shows that (for each wavelength) the radiation's relative intensity (the ratio $I/I_0$, where "I" is the intensity at depth "x" in the silicon and "$I_0$" is the incident intensity) decreases with increasing depth as the photons are absorbed by the silicon. FIGS. 1 and 4 show that relatively more blue (450 nm) photons are absorbed near the surface than are photons of longer wavelength, and that at any depth in the silicon, more green (550 nm) photons than blue photons are present and that more red (650 nm) photons than green photons are present (assuming equal incident intensity for red, green, and blue photons).

Each of the three curves of FIG. 1 (and FIG. 4) indicates an exponential intensity drop off with increasing depth, and is based on the measured behavior of light in crystalline silicon that has been subjected to typical doping and processing. The exact shape of each curve will depend on the parameters of doping and processing, but there will be only small differences between curves that assume different sets of doping and/or processing parameters. It is well known that the absorption of photons of different wavelengths by a semiconductor depends on the bandgap energy of the semiconductor material and on the details of the states at the band edges. It is also well known that typical semiconductors (e.g., silicon) have different absorptivity to different wavelengths.

As is apparent from FIGS. 1 and 4, a volume of silicon that functions as a sensor in a VCF sensor group at a given depth in a larger volume of the silicon, and has a given thickness, has greater absorptivity to blue light than green light and greater absorptivity to green light than red light. However, if the sensor silicon is sufficiently deep in the larger volume, most of the blue and green light will have been absorbed by the material above the sensor silicon. Even if light having a substantially flat wavelength-intensity spectrum is incident at the surface of the larger volume, the sensor can actually absorb more red light than green or blue light if the intensity of the green and blue light that reaches the sensor is much less than that of the red light that reaches the sensor.

Typical embodiments of a VCF sensor group achieve separation of colors by capturing photons in different ranges of depth in a volume of semiconductor material. FIG. 2 is a vertical doping profile for a VCF sensor group comprising top layer X01 (made of n-type semiconductor), second (p-type) layer X09 below the top layer, third (n-type) layer X02 below the second layer, fourth (p-type) layer X10 below the third layer, fifth (n-type) layer X03 below the fourth layer, and p-type semiconductor substrate X11 below the fifth layer.

Figure 3:
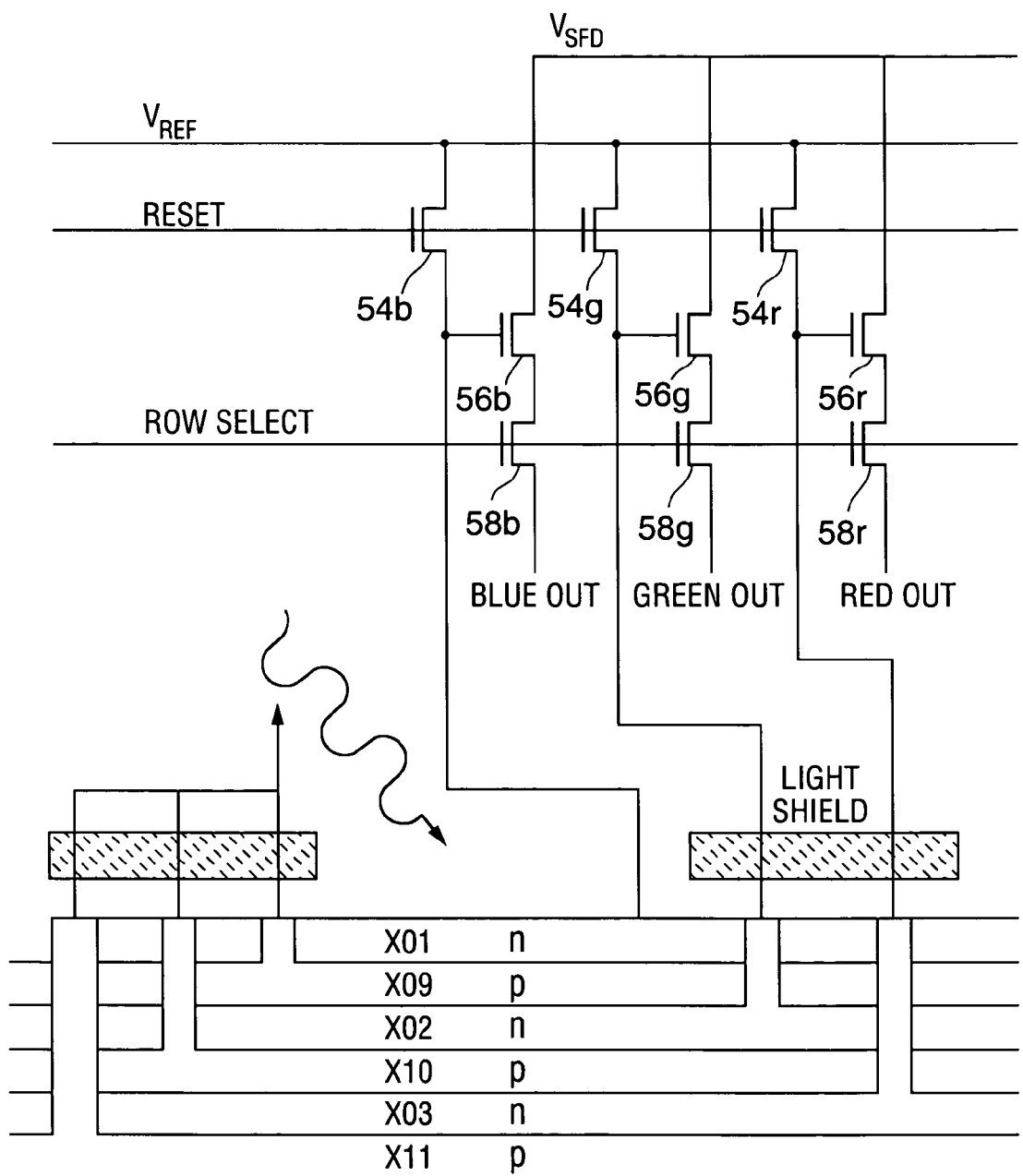
FIG. 3 is a simplified cross-sectional view (in a vertical plane) of the VCF sensor group whose profile is shown in FIG. 2, with a schematic circuit diagram of biasing and readout circuitry coupled to the sensor group.

FIG. 3 is a simplified cross-sectional view (in a vertical plane) of this VCF sensor group. As shown in FIG. 3, biasing and readout circuitry is coupled to layers X01, X02, X03, X09, and X10, and to substrate X11.

Blue, green, and red photodiode sensors are formed by the junctions between the n-type and p-type regions of FIG. 3, and are disposed at different depths beneath the surface of the semiconductor structure. The red, green, and blue photocharge signals are all taken from the n-type cathodes (X01, X02, and X03) of three isolated photodiodes. One respect in which FIG. 3 is simplified is that it does not show how n-type layer X01 is electrically isolated (as it normally would be) from the n-type contacts extending through it to underlying layers X02 and X03, how p-type layer X09 is electrically isolated (as it normally would be) from the p-type contacts extending through it to underlying layer X10 and region X11, how n-type layer X02 is electrically isolated (as it normally would be) from the n-type contact extending through it to underlying layer X03, or how p-type layer X10 is electrically isolated (as it normally would be) from the p-type contact extending through it to underlying region X11. The semiconductor structure of FIG. 3 could be implemented using techniques described in above-referenced U.S. Pat. No. 6,727,521 (e.g., techniques employed to implement the structure shown in FIG. 3 of U.S. Pat. No. 6,727,521).

The readout circuitry of FIG. 3 is of the non-storage type, and is similar to that described in above-referenced U.S. Pat. No. 6,727,521. Readout circuitry for each sensor includes a reset transistor (54*b* for the blue sensor, 54*g* for the green sensor, and 54*r* for the red sensor) driven from a RESET signal line and coupled between the photodiode cathode and a reset potential (identified as $V_{REF}$ in FIG. 3), a source-follower amplifier transistor (one of transistors 56*b*, 56*g*, and 56*r*) whose gate is coupled to the photodiode cathode and whose drain is maintained at potential $V_{SFD}$ during operation, and a row-select transistor (one of transistors 58*b*, 58*g*, and 58*r*) driven from a ROW-SELECT signal line and coupled between the source of the relevant source follower amplifier transistor and a row line. The suffixes "r," "g," and "b" are used to denote the wavelength band (red, green, or blue) associated with each transistor. As is known in the art, the RESET signal is active to reset the pixel and is then inactive during exposure, after which the row select line is activated to read out the detected signal.

Each of p-type regions X09, X10, and X11 is held at ground potential during operation. Each of n-type layers X01, X02, and X03 is a carrier-collection element having a contact portion accessible to (and that can be coupled to) the biasing and readout circuitry. Before each readout of the sensor group, the biasing circuitry resets each of the n-type layers to the reset potential (above ground potential). During exposure to radiation to be sensed, the reversed-biased pairs of adjacent p-type and n-type layers function as photodiodes: a first photodiode whose cathode is layer X01 and whose anode is layer X09; a second photodiode whose cathode is layer X02 and whose anodes are layers X09 and X10; and a third photodiode whose cathode is layer X03 and whose anodes are layers X10 and X11. As shown in FIG. 3, each of the n-type layers X01, X02, and X03 is coupled to biasing and readout circuitry and thus serves as a photodiode terminal.

During typical operation when the photodiodes of FIG. 2 are reverse biased, depletion regions are formed which encompass the majority of the silicon in which photons are absorbed. In FIG. 2, the depletion region for the first photodiode (which senses primarily blue light) is labeled "X04," the depletion regions for the second photodiode (which senses primarily green light) are labeled "X05" and "X06," and the depletion regions for the third photodiode (which senses primarily red light) are labeled "X07" and "X08." The fields within the depletion regions separate the electron hole pairs formed by the absorption of photons. This leaves charge on the cathode of each photodiode, and readout circuitry coupled to each cathode converts this charge into an electrical signal. The charge on the cathode of each photodiode is proportional to the number of photons absorbed by the photodiode. This proportionality is the quantum efficiency, QE.

FIG. 4 includes lines indicating the extent of the carrier-collection elements (X01, X02, and X03) and depletion regions of the FIG. 2 structure. Thus, the region labeled "X01+X04" in FIG. 4 represents the region of FIG. 2 above the lower surface of depletion region X04, the region labeled "X05+X02+X06" in FIG. 4 represents the region of FIG. 2 between the upper surface of depletion region X05 and the lower surface of depletion region X06, and the region labeled "X07+X03+X08" in FIG. 4 represents the region of FIG. 2 between the upper surface of depletion region X07 and the lower surface of depletion region X08. FIG. 4 thus illustrates the three distinct "sensor" regions in which the three photodiodes of FIG. 2 absorb photons and in which charge resulting from such absorption remains (and does not migrate outside the sensor region in which it is produced) and can be measured by readout circuitry. It should be recognized, however, that electron-hole pairs created between the three sensor regions (e.g., electron-hole pairs created in layer X09 between the lower surface of depletion region X04 and the upper surface of depletion region X05) can still diffuse (with high efficiency) into the sensor regions and create charge on the photodiodes that can be measured by readout circuitry.

The selective absorption of photons by wavelength determines the photo response of the three photodiodes. If one considers the position of the sensor regions ("X01+X04," "X05+X02+X06," and "X07+X03+X08") in relation to the curves of FIG. 4 for 450 nm, 550 nm and 650 nm photons, one will see that the depth and extent of the sensor regions determines the spectral response. In the "X01+X04" region, much more incident blue light is absorbed than incident green and red light, but some small amount of green and red light is absorbed. In the "X01+X04" region much less incident green light is absorbed than incident blue light, and much more incident green light is absorbed than incident red light. In the "X05+X02+X06" region, more incident green light is absorbed than incident blue light (since most of the blue light incident at region "X01+X04" is absorbed in that region and does not reach region "X05+X02+X06"), and more incident green light is absorbed than incident red light (even though only a small amount of the red light incident at region "X01+X04" is absorbed in that region so that most such red light reaches region "X05+X02+X06").

The full range of incident wavelengths (not just the three wavelengths 450 nm, 550 nm and 650 nm) determines the spectral response of the three photodiodes of FIG. 2.

Figure 5:
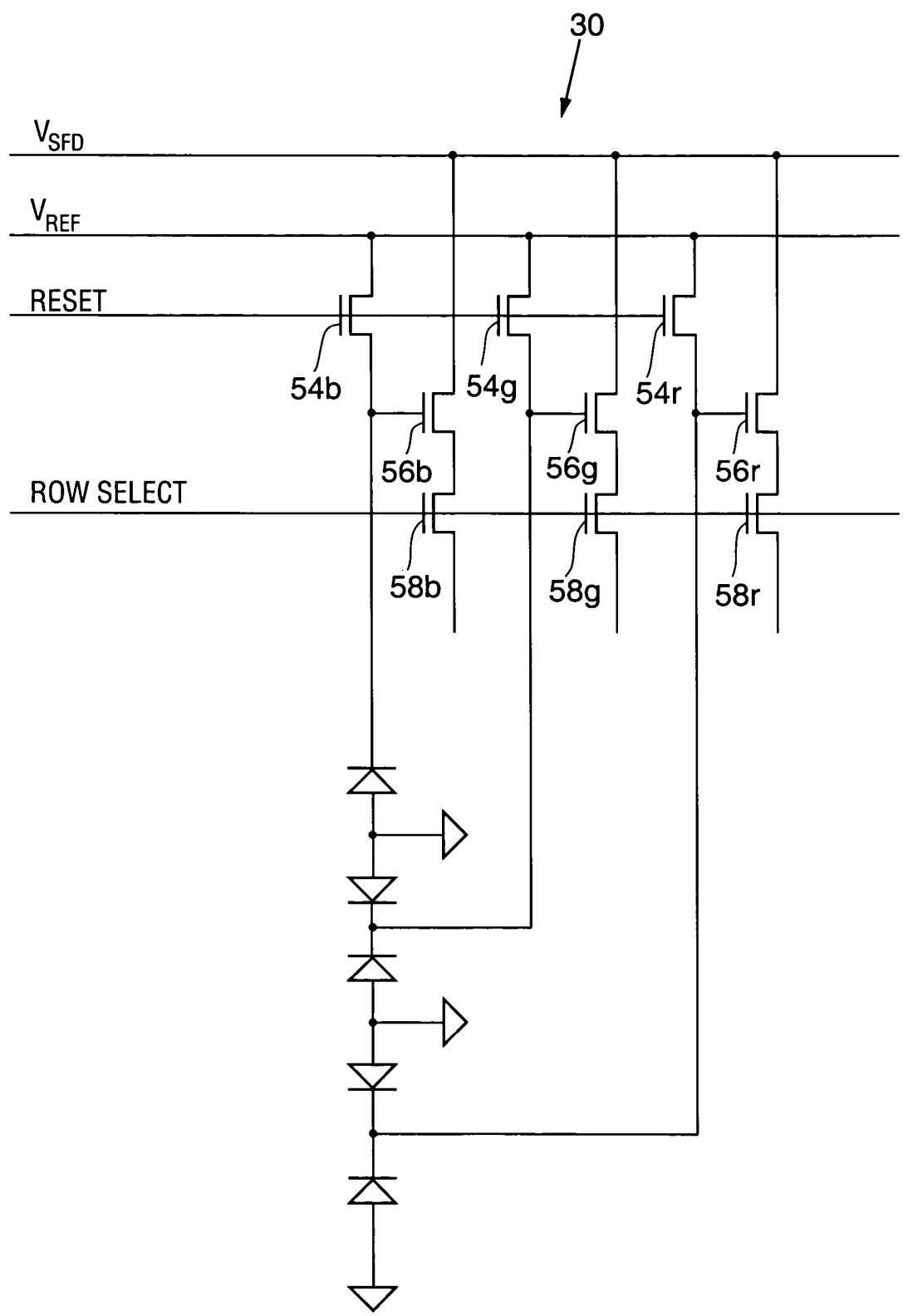
FIG. 5 is a diagram of the VCF sensor group and biasing and readout circuitry of FIG. 3, in which the photodiode sensors are represented schematically as semiconductor diode symbols.

In an important class of embodiments, each VCF sensor group of the inventive array implements three photodiodes. Such VCF sensor groups are well suited for use in a DSC or digital video camera. However, in other embodiments, each VCF sensor group of the inventive array implements two (or more than three) photodiodes placed at different depths within a volume consisting at least mainly of semiconductor material. The blue, green, and red photodiode sensors of the FIG. 3 sensor group are formed by the junctions between n-type and p-type regions, and are disposed at different depths beneath the surface of the semiconductor structure. The red, green, and blue photocurrent signals are all taken from the n-type cathodes of three isolated photodiodes. This is shown schematically in FIG. 5, which depicts the same VCF sensor group as is shown in FIG. 3. In FIG. 5, the photodiodes are represented schematically as semiconductor diode symbols.

From the disclosure herein, those of ordinary skill in the art will recognize that there are numerous ways to realize VCF sensor groups (and an array of VCF sensor groups that embodies the invention) in a semiconductor structure. For example, the six-layer structure of alternating p-type and n-type regions can be formed using a semiconductor substrate as the bottom layer and forming five concentric wells of alternating conductivity type in the substrate.

Each of FIGS. 3 and 5 shows a non-storage version of biasing and readout circuitry in which each of the red, green, and blue photodiodes is coupled to a transistor circuit. Each circuit has a reset transistor (54b, 54g, or 54r) driven from a RESET signal line and coupled between the photodiode cathode and a reset potential VREF, a source-follower amplifier transistor (56b, 56g, or 56r) coupled to the photodiode cathode, and a row-select transistor (58b, 58g, or 58r) driven from a ROW-SELECT signal line and coupled between the source of the source follower amplifier transistor and a column output line. As is known in the art, the RESET signal is active to reset the pixel and is then inactive during exposure, after which the row select line is activated to read out the pixel data.

In alternative embodiments, a "storage" version of biasing and readout circuitry, as described in above-referenced U.S. Pat. No. 6,864,557, is used in place of "non-storage" biasing and readout circuitry such as that of FIG. 3.

Figure 6:
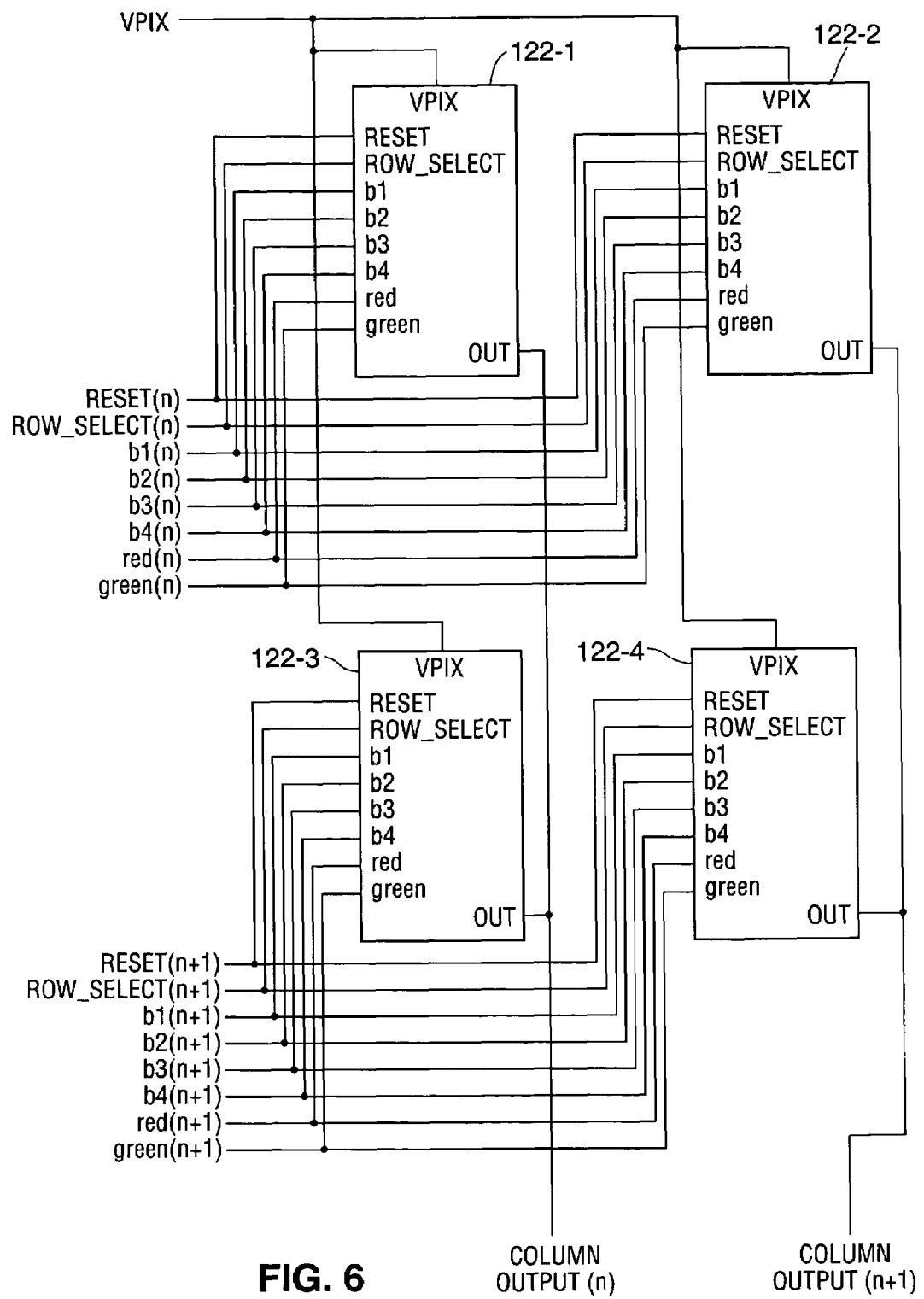
FIG. 6 is a diagram of an imaging array that can be implemented in accordance with the present invention.
Figure 6A:
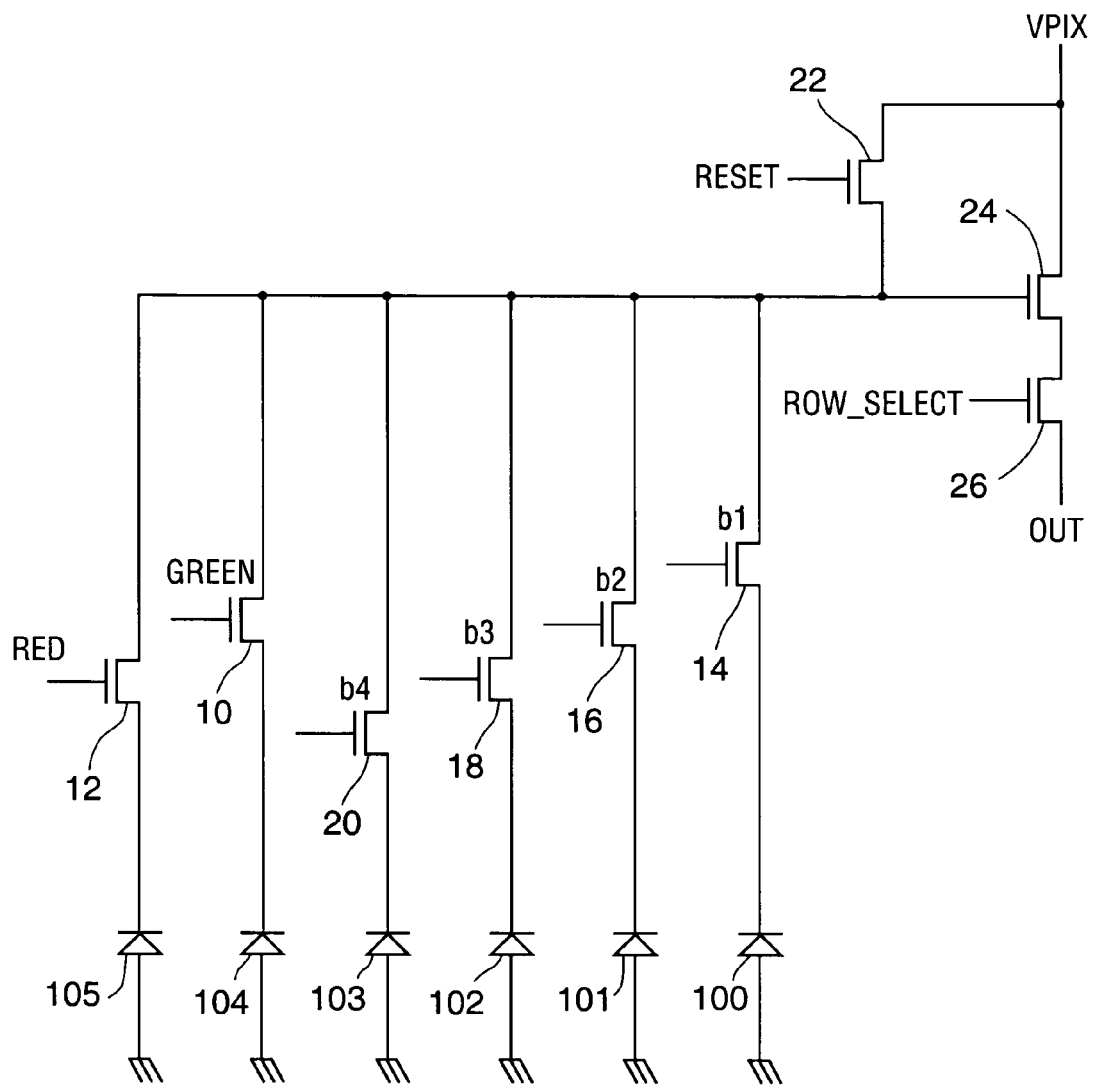
FIG. 6A is a schematic diagram of an embodiment of the structure within each of blocks 122-1, 122-2, 122-3, and 122-4 of FIG. 6.

FIG. 6 is a diagram of an array of sensor group cells 122-1, 122-2, 122-3, and 122-4, each cell including "S" VCF sensor groups, where S is a small integer. To implement the array in accordance with an embodiment of the invention, each of cells 122-1, 122-2, 122-3, and 122-4 has the structure shown in FIG. 6A and includes four VCF sensor groups. In this embodiment, the four VCF sensor groups of each cell include four blue sensors (photodiode sensors 100, 101, 102, and 103 of FIG. 6A), one green sensor (photodiode sensor 104 of FIG. 6A) shared by all four VCF sensor groups, and one red sensor (photodiode sensor 105 of FIG. 6A) shared by all four VCF sensor groups, with blue sensors 100, 101, 102, and 103 of the cell's VCF sensor groups together constituting a top layer of sensors, green sensor 104 underlying the blue sensors, and red sensor 105 underlying green sensor 104. In one implementation of FIG. 6A, sensors 100, 101, 102, 103, 104, and 105, respectively, have the same structure as sensors B1, B2, B3, B4, G, and R of FIGS. 7-8, and transistors 10, 12, 14, 16, 18, 20, 22, 24, and 26 are implemented in the same way (and perform the same functions) as the identically numbered transistors of FIG. 7. The array of FIG. 6 can be a portion of a larger array of VCF sensor groups (e.g., an array comprising more than two rows and more than two columns of sensor group cells).

As shown in FIG. 6, a separate reset line "RESET(n)" is provided for the VCF sensor groups of the "n"th row of sensor group cells of the array (i.e., reset line "RESET(n+1)" is provided for the (n+1)th row. Alternatively, a common RESET line can be provided for all of the VCF sensor groups in the array.

The array of FIG. 6 includes two rows and two columns of VCF sensor group cells: a first row includes VCF sensor group cells 122-1 and 122-2; a second row includes VCF sensor group cells 122-3 and 122-4; a first column includes VCF sensor groups 122-1 and 122-3; and a second column includes VCF sensor group cells 122-2 and 122-4. A first ROW-SELECT line ("row_select(n)") is connected to the row-select inputs (ROW-SELECT) of VCF sensor group cells 122-1 and 122-2. A second ROW-SELECT line ("row_select(n+1)") is connected to the row-select inputs (ROW-SELECT) of VCF sensor group cells 122-3 and 122-4. The first and second ROW-SELECT lines may be driven from a row decoder (not shown) as is well known in the art.

A first COLUMN OUT line ("column output(n)") is connected to the outputs of VCF sensor group cells 122-1 and 122-3. A second set COLUMN OUT line ("column output(n+1)") is connected to the outputs of VCF sensor group cells 122-2 and 122-4. The first and second COLUMN OUT lines would typically be coupled to column readout circuitry (not shown). RESET line reset(n) is connected to the reset inputs of VCF sensor group cells 122-1 and 122-2. RESET line reset(n+1) is connected to the reset inputs of VCF sensor group cells 122-3 and 122-4. A global VPIX line is connected to the nodes to be maintained at potential VPIX (e.g., each node corresponding to the node of FIG. 6A which is common to transistors 22 and 24 and maintained at potential "VPIX") of all of the VCF sensor group cells 122-1 through 122-4.

Sensor selection signal $b1(n)$ is asserted to the gate of the sensor selection transistor for blue sensor 100 (e.g., the gate of transistor 14 of FIG. 6A) of each of cells 122-1 and 122-2. Sensor selection signal $b2(n)$ is asserted to the gate of the sensor selection transistor for blue sensor 101 (e.g., the gate of transistor 16 of FIG. 6A) of each of cells 122-1 and 122-2. Sensor selection signal $b3(n)$ is asserted to the gate of the sensor selection transistor for blue sensor 102 (e.g., the gate of transistor 18 of FIG. 6A) of each of cells 122-1 and 122-2. Sensor selection signal $b4(n)$ is asserted to the gate of the sensor selection transistor for blue sensor 103 (e.g., the gate of transistor 20 of FIG. 6A) of each of cells 122-1 and 122-2. Sensor selection signal "red(n)" is asserted to the gate of the sensor selection transistor for red sensor 105 (e.g., the gate of transistor 112 of FIG. 6A) of each of cells 122-1 and 122-2. Sensor selection signal "green(n)" is asserted to the gate of the sensor selection transistor for green sensor 104 (e.g., the gate of transistor 10 of FIG. 6A) of each of cells 122-1 and 122-2.

Sensor selection signal b1(n+1) is asserted to the gate of the sensor selection transistor for blue sensor 100 of each of cells 122-3 and 122-4. Sensor selection signal b2(n+1) is asserted to the gate of the sensor selection transistor for blue sensor 101 of each of cells 122-3 and 122-4. Sensor selection signal b3(n+1) is asserted to the gate of the sensor selection transistor for blue sensor 102 of each of cells 122-3 and 122-4. Sensor selection signal b4(n+1) is asserted to the gate of the sensor selection transistor for blue sensor 103 of each of cells 122-3 and 122-4. Sensor selection signal "red(n+1)" is asserted to the gate of the sensor selection transistor for red sensor 105 of each of cells 122-3 and 122-4. Sensor selection signal "green(n+1)" is asserted to the gate of the sensor selection transistor for green sensor 104 of each of cells 122-3 and 122-4.

Figure 9:
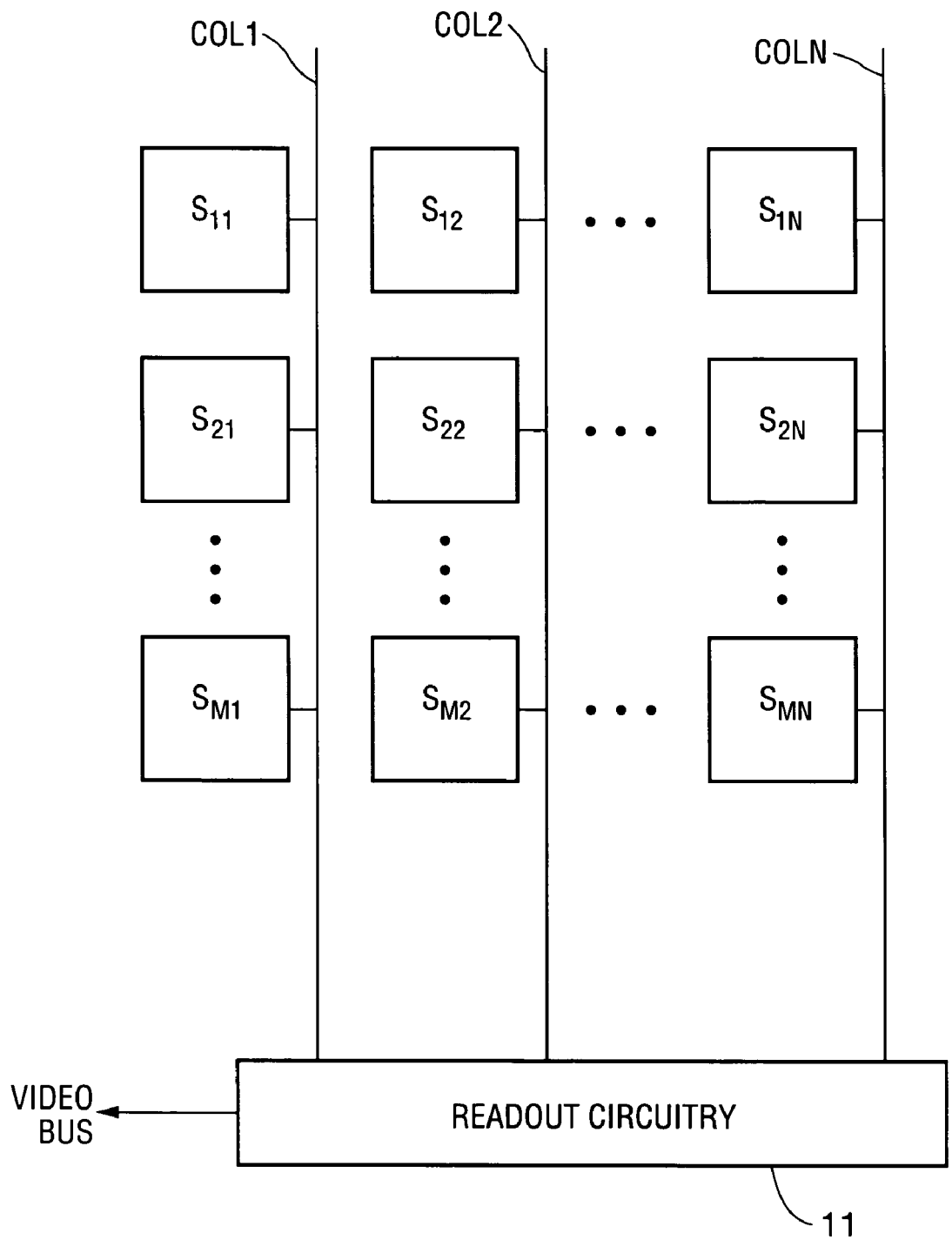
FIG. 9 is a block diagram of an embodiment of the inventive array of VCF sensor groups, including M rows and N columns of cells of VCF sensor groups. Each cell of VCF sensor groups can be cell including four VCF sensor groups having the structure shown in FIG. 7.

FIG. 9 is a block diagram of an embodiment of the inventive array of VCF sensor groups, including M rows and N columns of cells of VCF sensor groups. Each cell, Sij, of VCF sensor groups, where $1 \leq i \leq M$ and $1 \leq j \leq N$, can have the structure shown in FIG. 7. The array of FIG. 9 includes N column lines ($COL_1$-$COL_N$). When each cell of VCF sensor groups has the structure shown in FIG. 7, the output of each cell of VCF sensor groups would be coupled to one of the column lines. Readout circuitry 11 is coupled to each of the column lines and configured to generate image data and to assert the image data to a video bus in response to the signals received on the column lines during each readout of the array.

Figure 7:
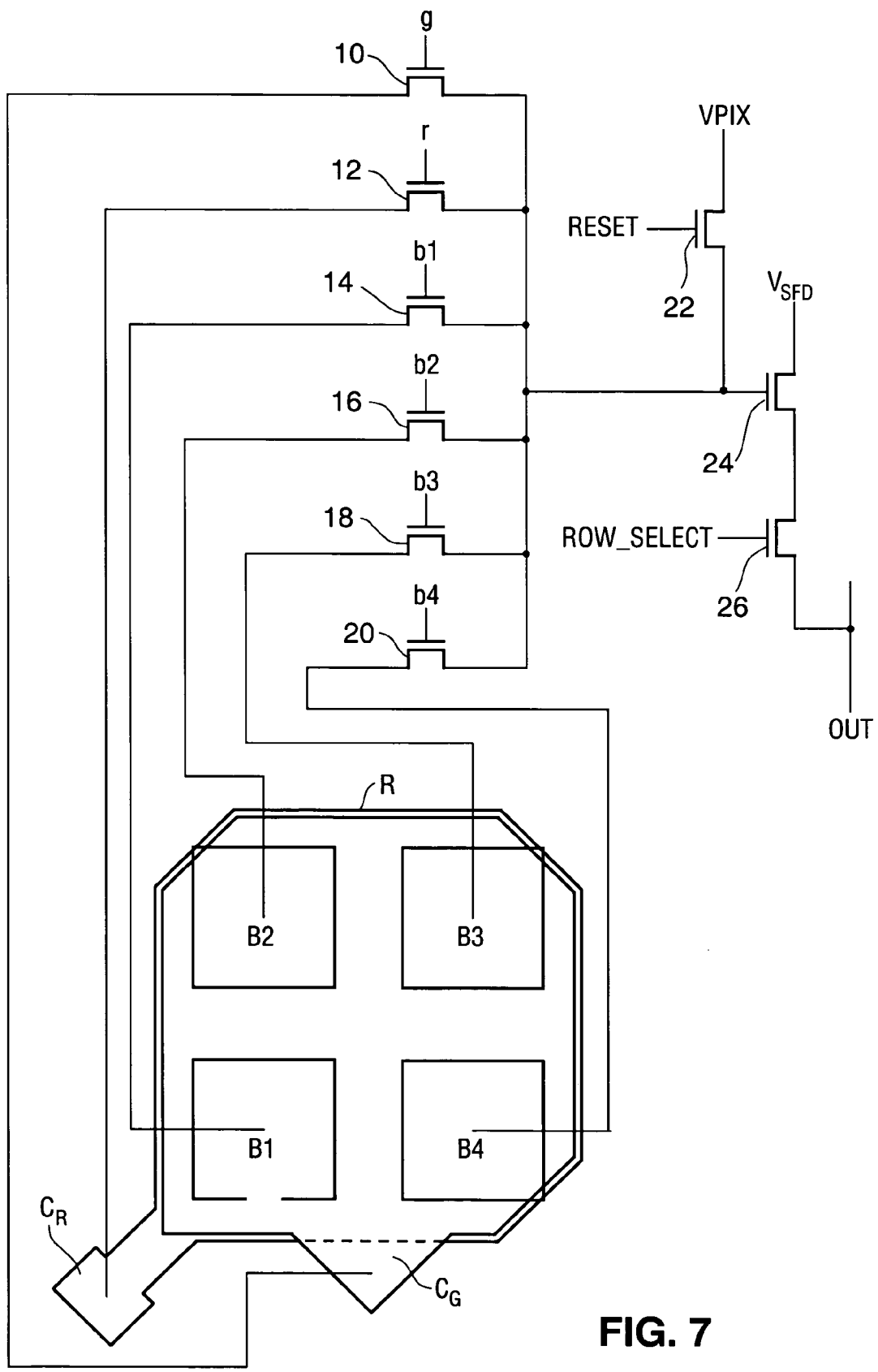
FIG. 7 is a simplified top view of a portion of an embodiment of the inventive array of VCF sensor groups (in which the low layers of adjacent sensor groups share carrier-collection elements), with bias and readout circuitry coupled to the sensor groups. The structure shown in FIG. 7 includes a cell of four VCF sensor groups, each of these VCF sensor groups including a different one of the four blue sensors (B1, B2, B3, and B4) shown.

In a class of implementations of the FIG. 9 array, each cell Sij of VCF sensor groups consists of four VCF sensor groups as shown in FIG. 7. Each VCF sensor group shown in FIG. 7 includes one blue sensor (one of sensors B1, B2, B3, and B4) whose carrier-collection area is not shared with any other sensor group, one green sensor "G" (shared with three other sensor groups), and one red sensor "R" (shared with three other sensor groups). The carrier-collection areas for green and red photons have size substantially equal to four times the size of each collection area for blue photons. As shown in FIG. 7, the carrier-collection areas (B1, B2, B3, and B4) for blue photons are laterally separated from each other. Preferably, the separation between these carrier-collection areas is sufficient to provide space for forming transistors (which are elements of bias and readout circuitry) on the array's top surface between them.

In the structure shown in FIG. 7, the electric charge collected on red sensor R (and each other red sensor of the array) is converted to an electrical signal indicative of about four times the average of the incident red intensity at the four VCF sensor groups that share the red sensor. The electric charge collected on green sensor G (and each other green sensor of the array) is converted to an electrical signal indicative of about four times the average of the incident green intensity at the four sensor groups which share the green sensor. Thus, the array's resolution with respect to blue light is about four times its resolution with respect to red or green light. The sharing of red and green sensors (but not blue sensors) among VCF sensor groups in this embodiment of the inventive array increases the signal to noise ratio in the green and red channels while maintaining high spatial resolution in the blue channel.

Readout circuitry for the sensor groups of FIG. 7 includes source-follower amplifier transistor 24 whose gate is coupled during readout (via one of sensor selection transistors 10, 12, 14, 16, 18, and 20) to the photodiode cathode of a selected one of sensors G, R, B1, B2, B3, and B4, and whose drain is maintained at potential $V_{SFD}$ during operation. The readout circuitry also includes row-select transistor 26 whose gate is driven from a ROW_SELECT signal line and whose channel is coupled between the source of transistor 24 and an output line ("OUT"). The gate of reset transistor 22 is driven by a RESET signal. Transistor 22's drain is maintained at reference potential VPIX during operation, and its source is coupled to the gate of transistor 24. As is known in the art, the RESET signal and sensor selection signals (g, r, b1, b2, b3 and b4) are active to reset the pixel by pulling the gate of transistor 24 up to the reference potential VPIX, and are then inactive during exposure. The following sequence can be used to read out the array after the exposure. First the sense node is reset by driving high the RESET signal and driving all of the sensor selection signals, (g, r, b1, b2, b3 and b4) low. Then the RESET signal is driven low, turning off transistor 22. Then to read the G sensor, the gate of transistor 10, g, is driven high, (while the other sensor selection signals, r, b1, b2, b3 and b4 are driven low) and the ROW_SELECT signal is also driven high which is the gate of transistor 26 to drive the sensor value out onto the column output line OUT. Before another sensor in the same row can be read out, the sense node has to be reset again by first driving low all of the sensor selection signals, g, r, b1, b2, b3 and b4 and driving the RESET signal high. After the sense node is reset, the RESET signal is driven low and the gate of transistor 12, r, is driven high to read out the R sensor while the gate of transistor 26, ROW_SELECT, is driven high. To read out B1, first the sensor selection signals, g, r, b1, b2, b3 and b4 are driven low and the RESET signal is driven high. After the sense node is reset, the RESET signal is driven low and the gate of transistor 14, b1, is driven high to read out the B1 sensor while the gate of transistor 26, ROW_SELECT, is driven high. To read out B2, first the sensor selection signals, g, r, b1, b2, b3 and b4 are driven low and the RESET signal is driven high. After the sense node is reset, the RESET signal is driven low and the gate of transistor 16, b2, is driven high to read out the B2 sensor while the gate of transistor 26, ROW_SELECT, is driven high. To read out B3, first the sensor selection signals, g, r, b1, b2, b3 and b4 are driven low and the RESET signal is driven high. After the sense node is reset, the RESET signal is driven low and the gate of transistor 18, b3, is driven high to read out the B3 sensor while the gate of transistor 26, ROW_SELECT, is driven high. To read out B4, first the sensor selection signals, g, r, b1, b2, b3 and b4 are driven low and the RESET signal is driven high. After the sense node is reset, the RESET signal is driven low and the gate of transistor 20, b4, is driven high to read out the B4 sensor while the gate of transistor 26, ROW_SELECT, is driven high.

In embodiments of the inventive array in which the VCF sensor groups are arranged in cells of "S" sensor groups (where S is a small number, and S=4 when the array is implemented as a 1-1-4 array) and each cell includes a single "sense" node (e.g., the gate of transistor 24 of FIG. 7) and sensor selection switches coupled between the cell's sensors and the sense node, sequential sampling of the sensors of each cell via the sensor selection switches (e.g., transistors 12, 14, 16, 18, and 20 of FIG. 7) at the cells' sense nodes allows the array's surface layer geometry to be much simpler (and typically also more amenable to depleted photodiodes) than that of a conventional VCF sensor group array having the same number of VCF sensor groups.

In FIG. 7, the electrically conductive contacts between the sensors and the gates of transistors 10, 12, 14, 16, 18, 20, and 24 is shown schematically. In practice, the array of FIG. 7 would typically be implemented as a block of solid material whose structures have been formed on a substrate (e.g., by a semiconductor integrated circuit fabrication process), and each of transistors 10, 12, 14, 16, 18, 20, 22, 24, and 26 would be implemented on or at a top surface of the array. A vertically oriented contact extending from the surface to red sensor R would be formed at location $C_R$ and another vertically oriented contact extending from the surface to green sensor G would be formed at location $C_G$ of FIG. 7. Examples of connections between sensors B1 and B2 and transistors 14, 16, and 24, in such an solid state implementation of the FIG. 7 array will be described with reference to FIG. 8.

Figure 8:
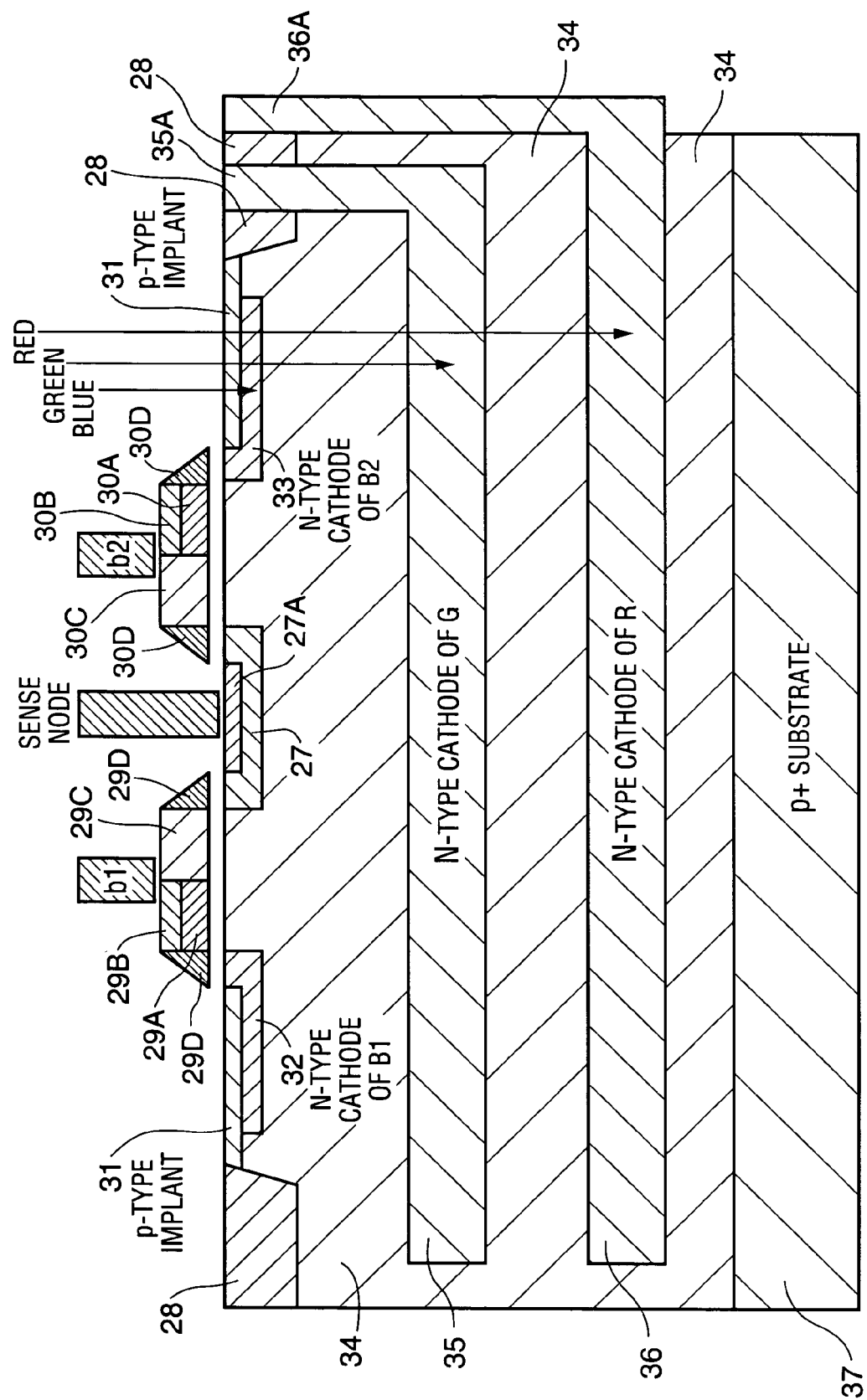
FIG. 8 is a side cross-sectional view of a portion of an implementation of sensor groups and readout circuitry similar to those of FIG. 7.

FIG. 8 is a side cross-sectional view of a portion of a solid state implementation of an array similar to the FIG. 7 array, formed on substrate 37. Substrate 37 consists of p-type semiconductor material. The FIG. 8 structure includes elements of a VCF sensor group comprising sensor B1 of FIG. 7 and slightly differently shaped versions of sensors G and R of FIG. 7, elements of a VCF sensor group comprising sensor B2 of FIG. 7 and slightly differently shaped versions of sensors G and R of FIG. 7, and transistors 14 and 16 and elements of transistor 24 of FIG. 7.

In FIG. 8, n-type semiconductor region 32 is a carrier-collecting cathode of blue sensor B1, n-type semiconductor region 33 is a carrier-collecting cathode of sensor B2, n-type semiconductor region 35 is a carrier-collecting cathode of green sensor G (shaped slightly differently than sensor G of FIG. 7 in that its contact portion 35A has a location relative to blue sensors B1 and B2 that is different than location $C_G$ of FIG. 7), and n-type semiconductor region 36 is a carrier-collecting cathode of red sensor R (shaped slightly differently than sensor R of FIG. 7 in that its contact portion 36A has a location relative to blue sensors B1 and B2 that is different than location $C_R$ of FIG. 7). Non-collecting photodiode anodes adjacent to cathodes 32, 33, 35, and 36 consist of grounded p-type semiconductor layers 34 and grounded p-type semiconductor implants 31.

Vertically oriented contact 35A is a portion of region 35 that extends from the major portion of region 35 to the surface of the chip. Vertically oriented contact 36A is a portion of region 36 that extends from the major portion of region 36 to the surface of the chip. Light shields 28, consisting of material having low transmissivity to the radiation to be sensed, are formed over the edge portions of regions 35 and 36 (and over boundary regions between regions 35 and 36 and corresponding cathode regions of other VCF sensor groups laterally displaced from the VCF sensor groups shown in FIG. 8). Metal contacts (not shown) would typically be formed over the upper ends of contacts 35A and 36A to couple contacts 35A and 36A to biasing and readout circuitry (i.e., to transistors 10 and 12 of FIG. 7). Light shields 28 (and metal contacts formed over the upper ends of contacts 35A and 36A) function to prevent radiation (normally incident at the array's top surface) from reaching contacts 35A and 36A, because charge photogenerated in contact 35A or 36A would reduce the array's frequency selectivity.

In FIG. 8, each p-type implant 31 (consisting of p-type semiconductor material that is more heavily doped than the p-type material 34) functions as a pinning layer to passivate surface states by appropriately positioning each p-n junction of each blue sensor between the blue sensor's cathode (cathode 32 or 33 or the cathode of blue sensor B3 or B4) and anode (comprising p-type semiconductor material 34 and 31). Specifically, implants 31 ensure that each p-n junction of each blue sensor is positioned away from the array's top surface.

Cathode 32 of blue sensor B1 also functions as the source of transistor 14. Cathode 33 of blue sensor B2 also functions as the source of transistor 16. N-type semiconductor region 27 (including region 27's more heavily doped n-type subregion 27A) functions as the drain of transistor 14 and the drain of transistor 16.

Polysilicon gate structure 29 (comprising n-type region 29A, more heavily doped n-type region 29C, and p-type region 29B) is the gate of transistor 14, polysilicon gate structure 30 (comprising n-type region 30A, more heavily doped n-type region 30C, and p-type region 30B) is the gate of transistor 16, electrically insulating gate sidewall spacers 29D are formed beside gate 29, and electrically insulating gate sidewall spacers 30D are formed beside gate 30, as shown. To fabricate the FIG. 8 structure, n-type regions 32, 27, and 33, and n-type polysilicon structures at the locations of gates 29 and 30, are formed in the indicated locations by ion implantation. Then, more heavily doped n+ regions 29C, 27A, and 30C are formed in the indicated locations by additional ion implantation. Then, p-type implants 31, 29B, and 30B, are formed in the indicated locations by additional ion implantation.

The "sense node" contact shown in FIG. 8 is coupled to n+ region 27A and to the drain of reset transistor 22 (shown in FIG. 7 but not FIG. 8). The contacts labeled "b1" and "b2" in FIG. 8 are coupled to the gates of transistors 14 and 16, respectively.

Regions 31 and 34 are held at ground potential during operation of the VCF sensor groups of FIG. 8. Before each exposure and readout of the sensor groups, biasing circuitry (including transistors 10, 12, 14, 16, 18, and 22, some of which are shown in FIG. 7 but not FIG. 8) resets each of n-type cathode regions 32, 33, 35, and 36 (and n-type cathode regions of blue sensors B3 and B4, which are located out of the plane of FIG. 8) to a reset potential (reference voltage VPIX above ground potential). During exposure to radiation to be sensed, reversed-biased pairs of adjacent p-type and n-type regions (32 and 34, 32 and 31, 33 and 34, 33 and 31, 35 and 34, and 36 and 34) function as photodiodes: a first photodiode (implementing the blue sensor B1) whose cathode is layer 32 and whose anode comprises portions of regions 34 and 31; a second photodiode (implementing the blue sensor B2) whose cathode is layer 33 and whose anode comprises portions of regions 34 and 31; third and fourth photodiodes (implementing blue sensors B3 and B4); a fifth photodiode (implementing the green sensor G) whose cathode is layer 35 and whose anode is a portion of region 34; and a sixth photodiode (implementing the red sensor R) whose cathode is layer 36 and whose anode is a portion of region 34. During readout, the cathodes of the six photodiodes are sequentially coupled to the sense node.

Typical values of the voltages (above ground potential) asserted to elements of the FIG. 7 array (implemented as shown in FIG. 8) are as follows: RESET=4.0 volts (during the reset step) and otherwise RESET=0 volts, VPIX=3.0 volts, VSFD=3.0 volts, ROW_SELECT=4.0 volts (during readout) and otherwise ROW_SELECT=0 volts, and the voltage asserted to the gate of each of sensor selection transistors 10, 12, 14, 16, 18, and 20 is 3.0 volts (to couple the relevant photodiode sensor cathode to the gate of transistor 24) and is otherwise 0 volts.

Simulations of the FIG. 9 array implemented as a "1-1-4" array (with each cell of four VCF sensor groups Sij having the structure shown in FIG. 7) have been performed. Also, simulations of FIG. 9 array implemented as "1-4-1" array (in which each cell of VCF sensor groups Sij is a cell of four VCF sensor groups including four distinct blue sensors, a single green sensor shared by all four VCF sensor groups, and four distinct red sensors below the green sensor) have been performed. The simulated images resulting from such simulations of 1-4-1 and 1-1-4 arrays (after simulated processing by a separated luma/chroma image data processing pipeline) are practically indistinguishable, with the darkest regions of images generated by the 1-4-1 array having just a slightly different noise character that the darkest regions of images generated by the 1-1-4 array.

Each 1-1-4 array that embodies the invention (e.g., the array of FIG. 9 with each cell of VCF sensor groups implemented as shown in FIG. 7 or 8) is preferably implemented with only two vertical contacts (e.g., plug contacts) per four sensor groups to its low layer sensors (e.g., the red and green sensors), in contrast with the minimum of five vertical contacts required per four sensor groups (one to the red layer and four to the green layer) to implement a 1-4-1 array. Reduction in the required number of vertical contacts is an important advantage of the inventive array which greatly simplifies layout of solid state implementations of the inventive array (e.g., implementations in which the array is a block of solid material including structures that have been formed on a semiconductor substrate). Each cell includes sensor selection switches (e.g., transistors formed on or at a top surface of the array) and allows layouts that are more compact (having higher fill factor) and more symmetrical than can be achieved with conventional arrays having the same number of VCF sensor groups.

In embodiments of the inventive array that include cells of VCF sensor groups (each cell including "S" sensor groups, where S is a small number, and S=4 when the array is implemented as a 1-1-4 array) in which each cell has a single "sense" node and sensor selection switches coupled between the cell's sensors and the sense node, noise results from capacitance on the photodiode side of each sensor selection switch because signal charge is incompletely shared with the sense node and the capacitance adds non-cancelable kTC noise. However, by sharing sensors at at least one low layer of each cell of VCF sensor groups (e.g., by implementing each cell with a shared green sensor and shared red sensor rather than "S" individual green sensors and "S" individual red sensors) and employing only one vertical contact between each shared sensor and the relevant sensor selection switch, it is much easier to implement the non-shared sensors of the top layer to have zero or nearly zero capacitance (e.g., to implement pinned, depleted photodiodes in the top layer to have nearly zero capacitance), thereby reducing the above-mentioned non-cancelable kTC noise to an acceptable level. It is expected that the inventive array can be implemented to provide a better signal-to-noise ratio in both luma and chroma than can conventional arrays of VCF sensor groups.

It is also expected that color-shading (color shift with incident angle) can be improved by implementing arrays of VCF sensor groups in accordance with the invention, since it is easier to optically shield vertical contacts at the corners of sets (e.g., cells) of VCF sensor groups (where the sensor groups of each such set share sensors) than at other locations within each such set (and all or most of the required vertical contacts can be implemented in such corners). When five vertical contacts are needed per set of four VCF sensor groups of the inventive array, and the set of four sensor groups has only four corners, at least one vertical contact must be located at an edge (rather than a corner) of the set where it is somewhat harder to shield. In the latter case, when the edge-positioned vertical contact extends to a low layer (e.g., to a green or red sensor), photons that enter the array near the edge-positioned vertical contact and are absorbed at a fairly shallow depth (e.g., between the blue and green layers) are likely to be collected by the vertical contact, which changes the color sensitivity compared to photons absorbed away from the edge-positioned vertical contact.

While best modes for implementing the present invention and applications of the invention have been described herein, it will be apparent to those of ordinary skill in the art that many variations on the embodiments and applications described herein are possible without departing from the scope of the invention described and claimed herein. It should be understood that while certain forms of the invention have been shown and described, the invention is not to be limited to the specific embodiments described and shown or the specific methods described. Further, the claims that describe methods do not imply any specific order of steps unless explicitly described in the claim language.

What is claimed is:

1. An array of vertical color filter sensor groups, wherein each of the sensor groups includes three vertically stacked, photosensitive sensors including a top sensor, the top sensors of all the sensor groups together constitute a top layer of sensors and the other sensors of the sensor groups together constitute two low layers of sensors, wherein the array is configured such that only the top layer can be read out with full resolution and each of the low layers can only be read out with less than full resolution.

2. The array of claim 1, wherein the array has a top surface and includes readout circuitry at the top surface, the top layer includes X top sensors, where X is a number, each of the low layers includes fewer than X sensors, and a contact extends from each sensor in each of the low layers to the readout circuitry.

3. The array of claim 2, wherein the array consists essentially of solid material including structures formed on a substrate, the structures implement the sensor groups and the readout circuitry, each of the low layers is implemented between the substrate and the top surface, and each said contact extends at least substantially vertically from each sensor in each of the low layers to the readout circuitry.

4. The array of claim 3, wherein the low layers include a bottom layer, and an intermediate layer between the top layer and the bottom layer, the bottom layer includes Y sensors, the intermediate layer includes Z sensors, and each of Y and Z is at least substantially equal to X/4.

5. The array of claim 1, also including readout circuitry coupled to the sensors of the sensor groups.

6. The array of claim 1, wherein at least one of the sensors of at least one of the low layers of sensors is a shared sensor, and each said shared sensor is shared by at least two of the sensor groups.

7. The array of claim 6, wherein at least one of the top sensors has a first size, and each said shared sensor has a size substantially greater than the first size.

8. The array of claim 1, also including readout circuitry coupled to each of the sensors of each of the sensor groups, wherein the array consists essentially of solid material including structures, formed on a substrate, that implement the sensor groups and the readout circuitry.

9. An array of vertical color filter sensor groups, wherein each of the sensor groups includes three vertically stacked, photosensitive sensors including a blue sensor, a green sensor, and a red sensor, the blue sensors of all the sensor groups together constitute a top layer of sensors, the green sensors of all the sensor groups together constitute an intermediate layer of sensors, and the red sensors of all the sensor groups together constitute a bottom layer of sensors, wherein the array is configured such that only the top layer can be read out with full resolution and each other layer can only be read out with less than full resolution.

10. The array of claim 9, also including readout circuitry coupled to each of the sensors of each of the sensor groups, wherein the array consists essentially of solid material including structures, formed on a substrate, that implement the sensor groups and the readout circuitry.

11. The array of claim 9, wherein the array includes X of the blue sensors, Y of the green sensors, and Z of the red sensors, where X>Y and X>Z.

12. The array of claim 11, wherein X is at least substantially equal to 4Y, and X is at least substantially equal to 4Z.

13. The array of claim 11, wherein the array has a top surface and the array also including:
readout circuitry at the top surface;
green sensor contacts, each of the green sensor contacts extending between one of the green sensors and the readout circuitry; and
red sensor contacts, each of the red sensor contacts extending between one of the red sensors and the readout circuitry.

14. The array of claim 13, wherein the array consists essentially of solid material including structure formed on a substrate, the structures implement the sensor groups and the readout circuitry, each of the green sensor contacts extends at least substantially vertically from one of the green sensors to the readout circuitry, and each of the red sensor contacts extends at least substantially vertically from one of the red sensors to the readout circuitry.

15. The array of claim 9, wherein at least one of the sensors of at least one of the intermediate layer and the bottom layer is a shared sensor, and each said shared sensor is shared by at least two of the sensor groups.

16. The array of claim 15, wherein at least one of the top sensors has a first size, and each said shared sensor has a size substantially greater than the first size.

17. The array of claim 9, wherein each of the sensors is configured to be biased to function as a photodiode, and has a carrier-collection element configured to collect photo-generated carriers when the sensors are biased to function as photodiodes, wherein the carrier-collection element of the each of the blue sensors is a minimum-sized carrier-collection element, and the carrier-collection element of each of the red sensors and the green sensors has an area, projected on a plane perpendicular to the normal axis, that is substantially larger than the area, projected on said plane, of the minimum-sized carrier-collection element.

* * * * *